(12) United States Patent
Wieting

(10) Patent No.: US 7,964,434 B2
(45) Date of Patent: Jun. 21, 2011

(54) SODIUM DOPING METHOD AND SYSTEM OF CIGS BASED MATERIALS USING LARGE SCALE BATCH PROCESSING

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 89 days.

(21) Appl. No.: 12/567,696

(22) Filed: Sep. 25, 2009

(65) Prior Publication Data

US 2011/0020978 A1    Jan. 27, 2011

Related U.S. Application Data

(60) Provisional application No. 61/101,662, filed on Sep. 30, 2008.

(51) Int. Cl.
  H01L 29/22        (2006.01)
  H01L 31/0256  (2006.01)
  H01L 29/221      (2006.01)
  H01L 29/207      (2006.01)
(52) U.S. Cl. .............................. 438/78; 438/96; 438/93
(58) Field of Classification Search .................... 438/78, 438/96, 93
   See application file for complete search history.

(56) References Cited

U.S. PATENT DOCUMENTS

| | | | |
|---|---|---|---|
| 4,996,108 A | 2/1991 | Divigalpitiya et al. | |
| 5,125,984 A | 6/1992 | Kruehler et al. | |
| 5,261,968 A | 11/1993 | Jordan | |
| 5,501,744 A | 3/1996 | Albright et al. | |
| 5,536,333 A | 7/1996 | Foote et al. | |
| 5,665,175 A | 9/1997 | Safir | |
| 6,077,722 A * | 6/2000 | Jansen et al. | 438/74 |
| 6,328,871 B1 | 12/2001 | Ding et al. | |
| 6,380,480 B1 * | 4/2002 | Norimatsu et al. | 136/256 |
| 7,319,190 B2 * | 1/2008 | Tuttle | 136/264 |
| 7,576,017 B2 * | 8/2009 | Tuttle | 438/800 |
| 7,846,750 B2 * | 12/2010 | Boyer, Jr. | 438/19 |
| 7,863,518 B2 * | 1/2011 | Terakawa et al. | 136/255 |
| 7,875,945 B2 * | 1/2011 | Krasnov et al. | 257/436 |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

(Continued)

Primary Examiner — Luan C Thai
(74) Attorney, Agent, or Firm — Kilpatrick Townsend & Stockton LLP

(57) ABSTRACT

A method of processing a plurality of photovoltaic materials in a batch process includes providing at least one transparent substrate having an overlying first electrode layer and an overlying copper species based absorber precursor layer within an internal region of a furnace. The overlying copper species based absorber precursor layer has an exposed face. The method further includes disposing at least one soda lime glass comprising a soda lime glass face within the internal region of the furnace such that the soda lime glass face is adjacent by a spacing to the exposed face of the at least one transparent substrate. Furthermore, the method includes subjecting the at least one transparent substrate and the one soda lime glass to thermal energy to transfer one or more sodium bearing species from the soda lime glass face across the spacing into the copper species based absorber precursor layer via the exposed face.

20 Claims, 6 Drawing Sheets

U.S. PATENT DOCUMENTS

| | | |
|---|---|---|
| 2006/0220059 A1 | 10/2006 | Satoh et al. |
| 2007/0089782 A1 | 4/2007 | Scheuten et al. |
| 2007/0151596 A1 | 7/2007 | Nasuno et al. |
| 2007/0169810 A1 | 7/2007 | Van Duren et al. |
| 2008/0041446 A1 | 2/2008 | Wu et al. |
| 2008/0092945 A1 | 4/2008 | Munteanu et al. |
| 2008/0092953 A1 | 4/2008 | Lee |

OTHER PUBLICATIONS

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

* cited by examiner

SODIUM DOPING METHOD AND SYSTEM OF CIGS BASED MATERIALS USING LARGE SCALE BATCH PROCESSING

CROSS-REFERENCES TO RELATED APPLICATIONS

This application claims priority to U.S. Provisional Patent Application No. 61/101,662, filed Sep. 30, 2008, entitled "SODIUM DOPING METHOD AND SYSTEM OF CIGS BASED MATERIALS USING LARGE SCALE BATCH PROCESSING" by inventor Robert D. Wieting, commonly assigned and incorporated by reference herein for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and system for fabricating thin film solar cells. Merely by way of example, the present method includes a sodium doping method for manufacture of CIGS based photovoltaic cells using on a large scale batch processing, but it would be recognized that the invention may have other configurations.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, integration of electrode layers, substrates with uncontrolled sodium content, and overlying absorber layers is also problematic. These and other limitations of these conventional technologies can be found throughout the present specification and more particularly below.

BRIEF SUMMARY OF THE INVENTION

The present invention relates generally to photovoltaic materials and manufacturing method. More particularly, the present invention provides a method and system for fabricating thin film solar cells. Merely by way of example, the present method includes a sodium doping method for manufacture of CIGS based photovoltaic cells using on a large scale batch processing, but it would be recognized that the invention may have other configurations.

In a specific embodiment, the present invention provides a method of processing a plurality of photovoltaic materials in a batch process. The method includes providing at least one transparent substrate having an overlying first electrode layer and an overlying copper species based absorber precursor layer within an internal region of a furnace. The overlying copper species based absorber precursor layer has an exposed face. Additionally, the method includes disposing at least one soda lime glass comprising a soda lime glass face within the internal region of the furnace such that the soda lime glass face is adjacent to the exposed face of the at least one transparent substrate. The soda lime glass face and the exposed face of the one transparent substrate are configured by a spacing between the soda lime glass face and the exposed face of the one transparent substrate. Furthermore, the method includes subjecting the at least one transparent substrate and the one soda lime glass to thermal energy to transfer one or more sodium bearing species from the soda lime glass face across the spacing into the copper species based absorber precursor layer via the exposed face.

In another specific embodiment, the present invention provides a method of processing a plurality of photovoltaic materials in a batch process. The method includes providing a plurality of soda lime glass substrates arranged in a sequential manner numbered from 1 through N within a furnace. Each of the soda line glass substrates has an overlying first electrode layer and an overlying copper species based absorber precursor layer having an exposed face. Each of the soda line glass substrates also has a backside composed of a portion of the soda lime glass substrate. Each backside of the soda lime glass substrate numbered from 2 to N faces at least one exposed face of a neighbor soda line glass substrate numbered from 1 to N−1. At least the exposed face numbered N facing a blank soda lime glass face which is also within the furnace. Here N is an integer greater than 2. Additionally, the method includes subjecting the plurality of soda lime glass substrates and the blank soda lime substrate to thermal energy within the furnace to transfer one or more sodium bearing species to the exposed face of the copper species based absorber precursor layer for each of the soda lime glass substrates to dope each of the copper species based absorber precursor layer with sodium bearing species.

Many benefits can be achieved by applying the embodiments of the present invention. Particularly, a sodium doping process serves an important step for forming copper based chalcopyrite structured high efficiency photovoltaic absorber layer. The present invention provides a efficient way using large scale batch system processing to perform the sodium doping to achieve a well controlled sodium concentration in the formed absorber layer. The method simplifies the doping process through a specific configuration of a plurality of soda lime glass substrates that come from the same batch system. The sodium doping process also can be advantageously performed in a same thermal treatment process of forming a photovoltaic absorber layer of copper indium diselenide (CIS) or copper indium gallium diselenide (CIGS) in chalcopyrite structure with large grain sizes for achieving high efficiency of thin film solar cells thereof. Of course, there can be other variations, modifications, and alternatives.

These and other benefits may be described throughout the present specification and more particularly below.

DETAILED DESCRIPTION OF THE INVENTION

The present invention relates generally to photovoltaic materials and manufacturing method. More particularly, the present invention provides a method and system for fabricating thin film solar cells. Merely by way of example, the present method includes a sodium doping method for manufacture of CIGS based photovoltaic cells using on a large scale batch processing, but it would be recognized that the invention may have other configurations.

Figure 1:
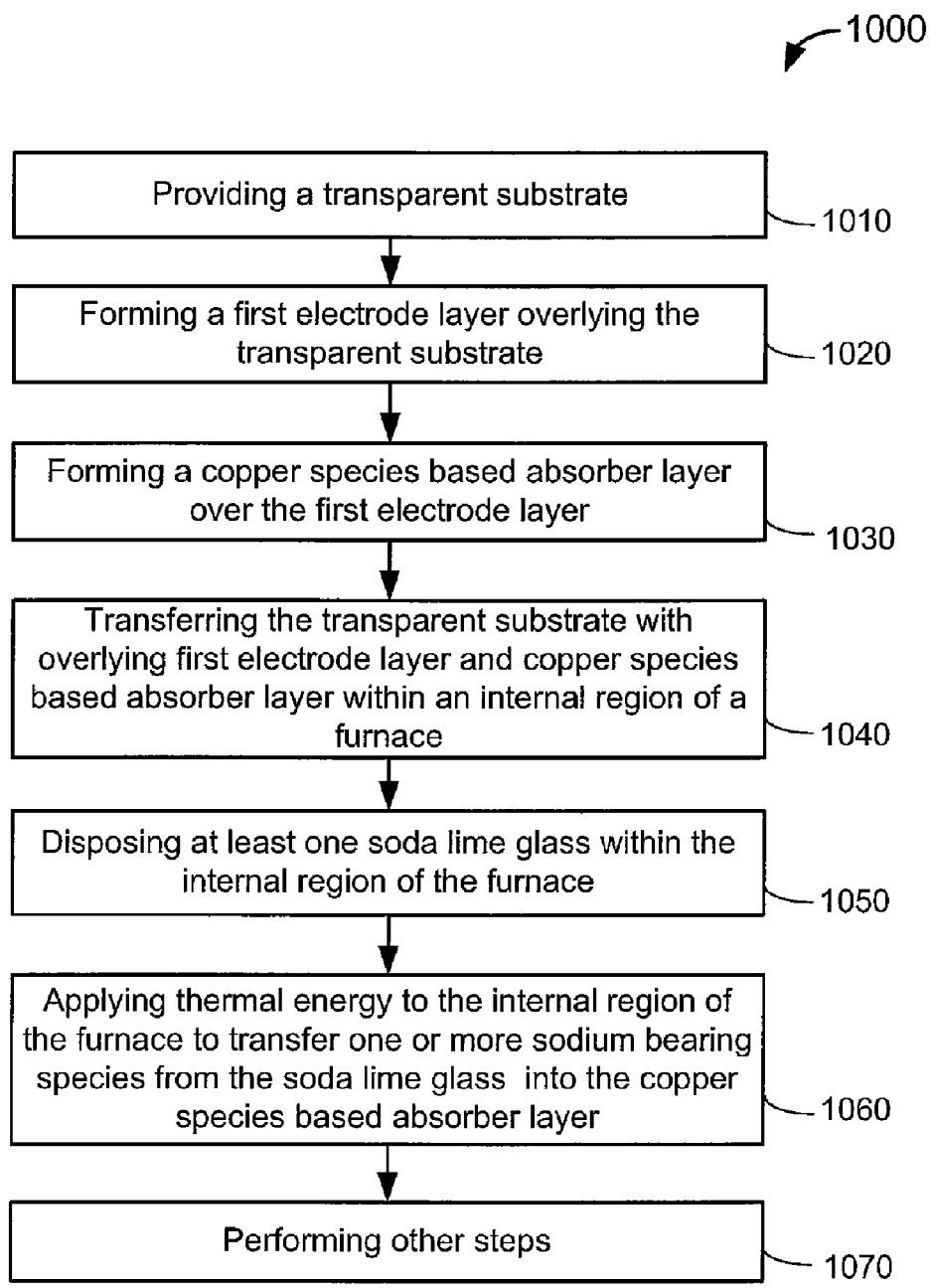
FIG. 1 is a simplified flowchart illustrating a method of fabricating a thin film solar cells according to an embodiment of the present invention.

FIG. 1 is a simplified flowchart illustrating a method of fabricating a thin film photovoltaic cell according to an embodiment of the present invention. This diagram is merely an example, which should not unduly limit the scope of the claims herein. The method 1000 includes the following processes:

1. Process 1010 for providing at least one transparent substrate;
2. Process 1020 for forming a first electrode layer overlying the transparent substrate;
3. Process 1030 for forming a copper species based absorber precursor layer over the first electrode layer, the copper species based absorber precursor layer having an exposed face;
4. Process 1040 for transferring the transparent substrate with overlying first electrode layer and overlying copper species based absorber precursor layer within an internal region of a furnace;
5. Process 1050 for disposing at least one soda lime glass within the internal region of the furnace, the soda lime glass having a surface being a spacing away from the exposed face;
6. Process 1060 for applying thermal energy to the internal region of the furnace to transfer one or more sodium bearing species in the soda lime glass across the spacing into the copper species based absorber precursor layer via the exposed face;
7. Process 1070 for forming a photovoltaic absorber layer; and
8. Process 1080 for performing other steps.

The above sequence of processes provides a method and system of doping sodium species into a copper species based absorber precursor layer for fabricating thin film solar cells according to an embodiment of the present invention. In a specific embodiment, the method includes performing one or more deposition processes, in one chamber or several compartments of a single chamber of a large scale batch system, on a work piece by forming a copper species based absorber precursor layer over an electrode layer on a transparent substrate before transferring the work piece to a furnace of the large scale batch system. In another specific embodiment, the method also includes disposing a soda lime glass in a configuration for performing a sodium doping. Other alternatives can also be provided where processes are added, one or more processes are removed, or one or more processes are provided in a different sequence without departing from the scope of the claims herein. Some processes mentioned above can be performed in a different order while other processes may be inserted in between. Further details of the method can be found throughout the present specification and more particularly below.

Figure 2:
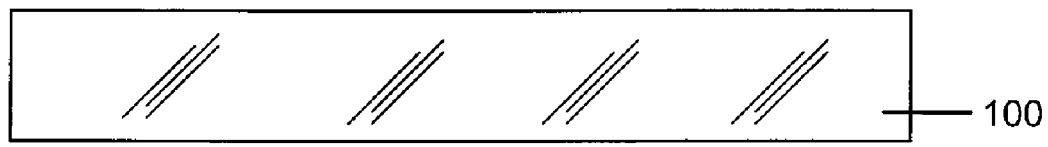
FIGS. 2-8 are schematic diagrams illustrating a method comprising a series of processes and structures for fabricating thin film solar cells according to certain embodiments of the present invention.

At Process 1010, a transparent substrate is provided. This process can be visually illustrated by FIG. 2. FIG. 2 is a simplified diagram illustrating a transparent substrate provided for fabricating a thin film solar cell according to an embodiment of the present invention. This diagram is merely an example, which should not unduly limit the scope of the claims herein. One of ordinary skill in the art would recognize many variations, alternatives, and modifications. As shown, the transparent substrate 100 is provided. In one implementation, the transparent substrate 100 uses a soda lime glass which has been widely used as window glass as well as the substrate for forming thin film solar cells due to an obvious economical reason. The soda lime glass naturally contains alkaline ions including sodium bearing concentration of 10% by weight and greater. The sodium species in the soda lime glass substrate provides a positive influence on the grain growth of thin film photovoltaic materials thereon. For example, copper species based compound semiconductor such as chalcopyrite $CuIn(Ga)Se_2$ or $CuInSe_2$ materials can be formed to serve as photovoltaic absorber layer on soda lime glass substrates with coarse grain sizes of 1 microns or larger. The sodium species also acts as a dopant in the photovoltaic absorber layer for enhancing the photon-electron conversion via a pn junction. Thus, the solar cell based on such absorber layer can have high cell current to achieve light-conversion efficiencies of 17% or above.

Figure 3:
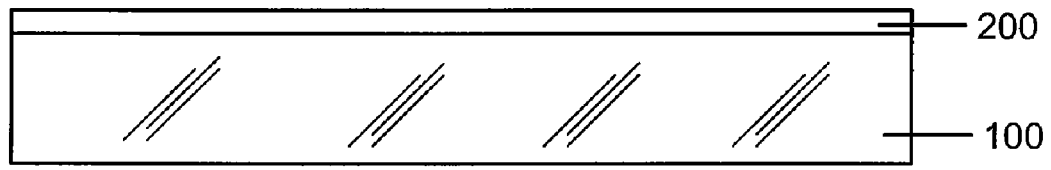

A Process 1020, a first electrode layer is formed overlying the transparent substrate. This process can be visually illustrated by FIG. 3. FIG. 3 is a simplified diagram illustrating a transparent substrate provided for fabricating a thin film solar cell according to an embodiment of the present invention. This diagram is merely an example, which should not unduly limit the scope of the claims herein. One of ordinary skill in the art would recognize many variations, alternatives, and modifications. As shown, the first electrode layer 200 is formed over the transparent substrate 100. In one example, the first electrode layer comprises a layer of molybdenum material. In some implementation, a layer of molybdenum material can be pre-coated on the commercially available soda lime glass when it is provided as the transparent substrate. In other implementations, the first electrode layer 200 is formed using one of a plurality of batch system processes on a soda lime glass substrate that is uncoated and pre-washed. The first electrode layer 200 functionally serves a lower or back electrode layer for the thin film solar cells to be formed thereafter. In a specific embodiment, the first electrode layer 200 formed using the batch system processing includes a bi-layer structured molybdenum material. Particularly, the bi-layered first electrode layer includes a first molybdenum layer with a smaller thickness and in tensile stress followed by a second molybdenum layer with a larger thickness and in compressive stress. The first molybdenum layer can be formed overlying the transparent substrate using a sputtering process at relative lower pressure of about 2 millitorr. The second molybdenum layer then can be formed using a sputtering process at relative higher pressure of about 20 millitorr. The second molybdenum layer has a thickness ranging from 2000 Angstroms to 7000 Angstroms and about ten times thicker than the first molybdenum layer. Such bi-layer molybdenum structure with a desired strain field provides benefit of using a laser patterning process to form certain patterns substantially free of film cracking. More detail descriptions about the bi-layered molybdenum structure as the first electrode layer and its formation processes can be found in a U.S. patent application entitled "THIN FILM SODIUM SPECIES BARRIER METHOD AND STRUCTURE FOR CIGS BASED THIN FILM PHOTOVOLTAIC CELL" filed on the same day as the present application by inventor Robert D. Wieting, which is commonly assigned and hereby incorporated by reference herein.

In certain specific embodiment, a thin barrier layer made of silicon oxide can be added first on the soda lime glass substrate before deposition of the first electrode layer. The barrier layer serves a diffusion barrier to substantially prevent uncontrolled amount of sodium species existed in the soda lime glass from mixing into the first electrode layer thereafter and films beyond. Of course, there can be other modifications, variations and alternatives.

Figure 4:
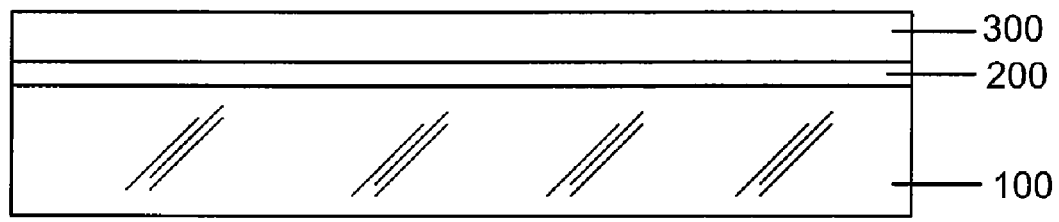

Referring to FIG. 1, the method 1000 includes a process (1030) of forming a copper species based absorber precursor layer over the first electrode layer. As shown schematically in FIG. 4, the copper species based absorber precursor layer 300 has an exposed face 301. In an example, the copper species based absorber precursor layer is made of a multilayer structure or composite film including at least a copper layer, or a copper-rich alloy (including both Cu and Ga) layer, and an indium layer. Each layer of the multilayer structure can be formed by a sputtering process that can be performed within a single vacuum chamber or separately in a different compartment of the same vacuum chamber. AC sputtering process is used with the substrate being held at near a room temperature and assisted by Argon working gas. Of course, there can be many alternatives, variations, and modifications to deposit or coat the copper species based film on top of the first electrode layer 200.

In another specific embodiment, the copper species based absorber precursor layer 300 is formed aiming to form a thin film photovoltaic absorber layer through one or more treatment processes to be carried out. One immediate treatment process is a controlled sodium doping process according to an embodiment of the present invention, which is to be described in more detail below. In a specific embodiment, the copper species based absorber precursor layer 300 is just a precursor layer based on which a high efficiency photovoltaic absorber layer can be formed with the assistance of the sodium doping under one or more additional treatment processes. For example, one type of such photovoltaic absorber layer is a copper based chalcopyrite compound semiconductor $CuInGaSe_2$ (CIGS) in a corresponding one of the additional treatment process. With a suitable content of sodium being doped, the formed absorber layer can have large size grains in chalcopyrite structure contributing large cell current for the solar cells formed thereof. Sodium doping also ensures favorable doping characteristics for the photovoltaic absorber.

Figure 5:
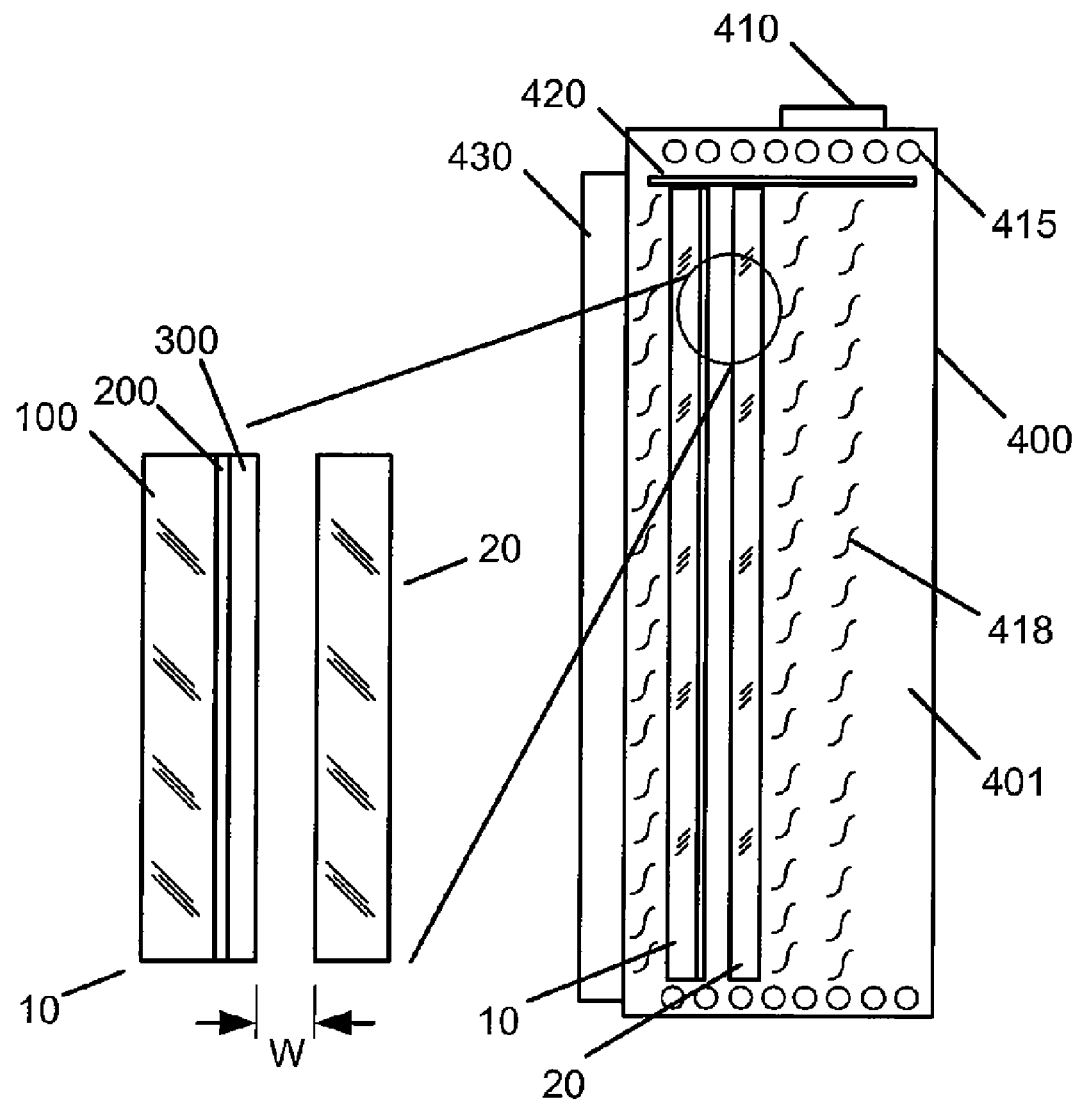

Referring to FIG. 1 again, the method 1000 includes a process (1040) of transferring the transparent substrate with overlying first electrode layer and overlying copper species based absorber precursor layer within an internal region of a furnace. Through a series of batch system processing at least from the Process 1010 to the Process 1030, a work piece should form to include a copper species based absorber precursor layer 300 on a first electrode layer 200 overlying a transparent substrate 100. As schematically shown in FIG. 5, such a work piece 10 can be transferred into an internal region 401 of a furnace 400. In one embodiment, the furnace 400 can be configured to be one part of a large scale batch system for manufacturing thin film solar cells. The same large scale batch system has been used to at least execute the process 1010 through 1030 for forming the work piece 10. In one implementation, the furnace 400 is also configured to couple with a power supply 410 with temperature control generate desired thermal energy 418 within the internal region 401. As shown, a plurality of heating elements 415 can be disposed throughout the internal sides of the internal region 401. These heating elements 415 can be controlled by the power supply to quickly ramp up the interior temperature from room temperature to 500 degree Celsius or higher with predetermined rates and then to maintain at a desired temperature with accuracy of about +/−a few degree Celsius for a predetermined time period.

In a specific embodiment, the furnace 400 is also configured to have a mechanical hanger 420 and a loading device 430. As shown in FIG. 5, a work piece 10 can be loaded into the furnace through the loading device 430 and hanged under the hanger 420 such that the work piece 10 is disposed substantially in vertical direction relative to gravitational force. In one example, the work piece 10 (or essentially the original transparent substrate 100) has been prepared with a hole located near one edge. Correspondingly the hanger has a hook configured to pass through the hole so that the work piece 10 is hanged under the hanger 420.

Similarly, a soda lime glass can be prepared to have substantially the same geometry of the transparent substrate 100 including hole near one edge and can be loaded into the furnace in the same fashion. This is in fact is performed by a process 1050 of the method 1000 according to an embodiment of the present invention. Also shown in FIG. 5, the soda lime glass 20 has been loaded and disposed next to the work piece 10. From the enlarged view of the circled part in FIG. 5, the relative configuration of the work piece 10 and the soda lime glass 20 is clearly seen. In particular, the work piece 10 has a spacing W apart from the soda lime glass. Since both the work piece 10 and the soda lime glass 20 are hanged freely in vertical direction, the spacing W is substantially the same from the top edge to bottom edge. In one implementation, the spacing W is about a centimeter to a few centimeters or less but can be greater. Additionally, it is the coated side of the work piece 10, i.e., an exposed face of the copper species based absorber precursor layer 300, that directly faces one surface of the soda lime glass. This orientational configuration is required to facilitate sodium doping process with a desired doping level and a reduced contamination level.

In an alternative embodiment, the spacing W allows a spatial region for a medium work gas existed between a bare soda lime glass surface and the exposed face of the copper species based absorber precursor layer. For example, hydrogen selenide ($H_2Se$) is used as the work gas filled in the whole internal region 401. The supply of $H_2Se$ is tuned (flow rate, pressure) so that an exchange reaction occurs at the soda lime glass surface where a selenization process of sodium takes place to help Na+ out of the glass (replaced by $H^+$). But $H_2Se$ supply is controlled to provide just enough $Na_2Se$ while not over selenize the glass. More details about the role of $H_2Se$ will be seen in later sections.

Figure 6:
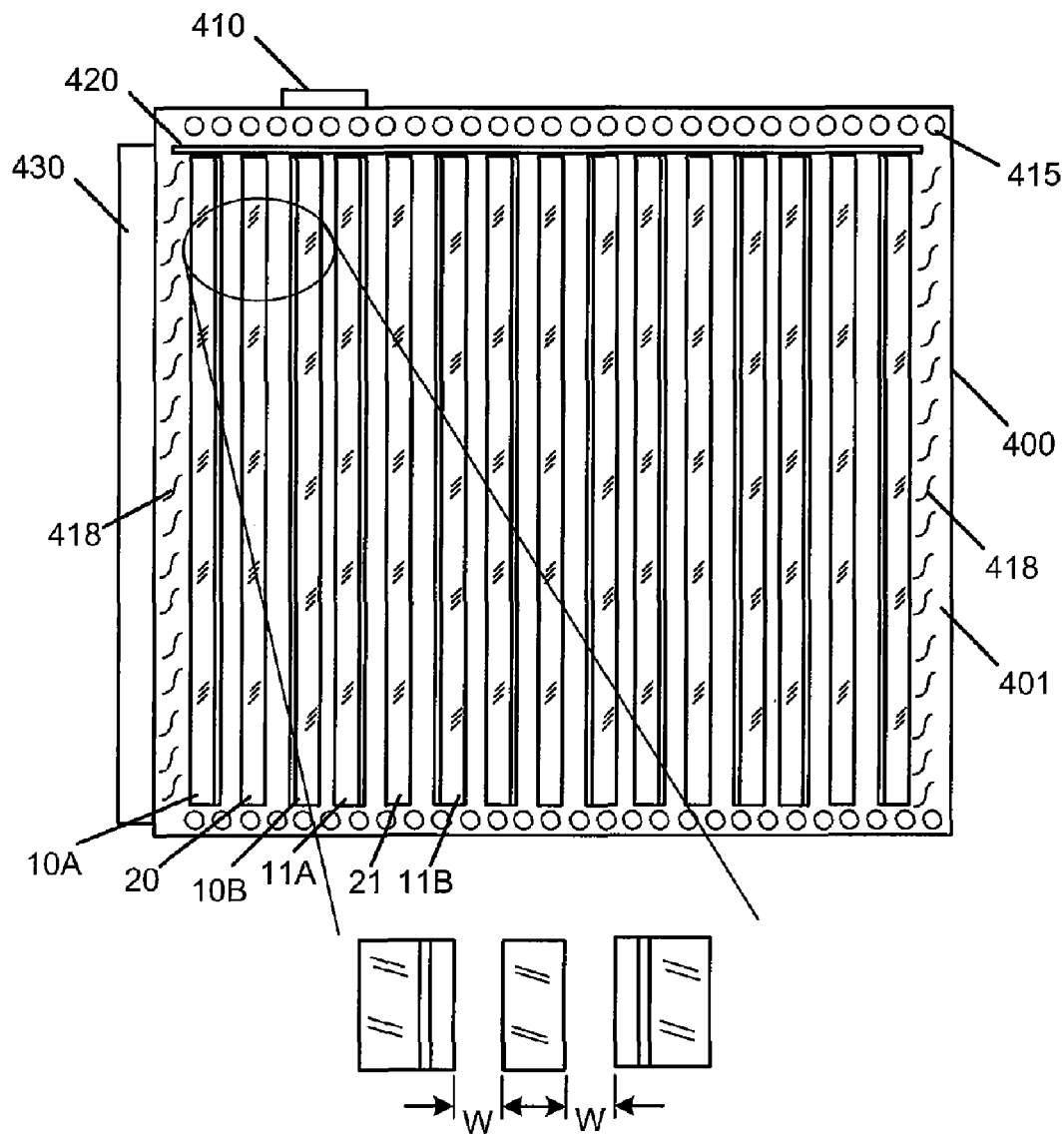

In an alternative embodiment, a plurality of work pieces as well as more soda lime glass pieces can be loaded into the furnace, depending on the design capacity of the furnace in the corresponding large scale batch system. As schematically shown in FIG. 6, a plurality of work pieces 10A, 10B, 11A, 11B, etc, and more soda lime glass pieces 20, 21, etc, are loaded into the internal region 401 of the furnace 400. Each work piece has an expose face of a copper species based absorber precursor layer (e.g., layer 300 of the work piece 10 in FIG. 5) and each soda lime glass naturally has two surfaces. In a specific embodiment, one loading configuration is to dispose a soda lime glass between the two work pieces with one facing forward and the other facing backward such that each surface of the soda lime glass directly faces an exposed face of one of the two work pieces, as seen in the enlarged view of the circled portion in FIG. 6. The hanger 420 has been configured to hold the three pieces so that a substantially fixed and predetermined spacing W between the surface of the soda lime glass and the exposed face of each work piece (with absorber precursor film). Therefore, the three pieces mentioned above form a group. In one implementation, the spacing W is about a centimeter to a few centimeters or less but can be greater. All other pieces can be loaded in same way group by group, until the furnace capacity is exhausted.

Figure 6A:
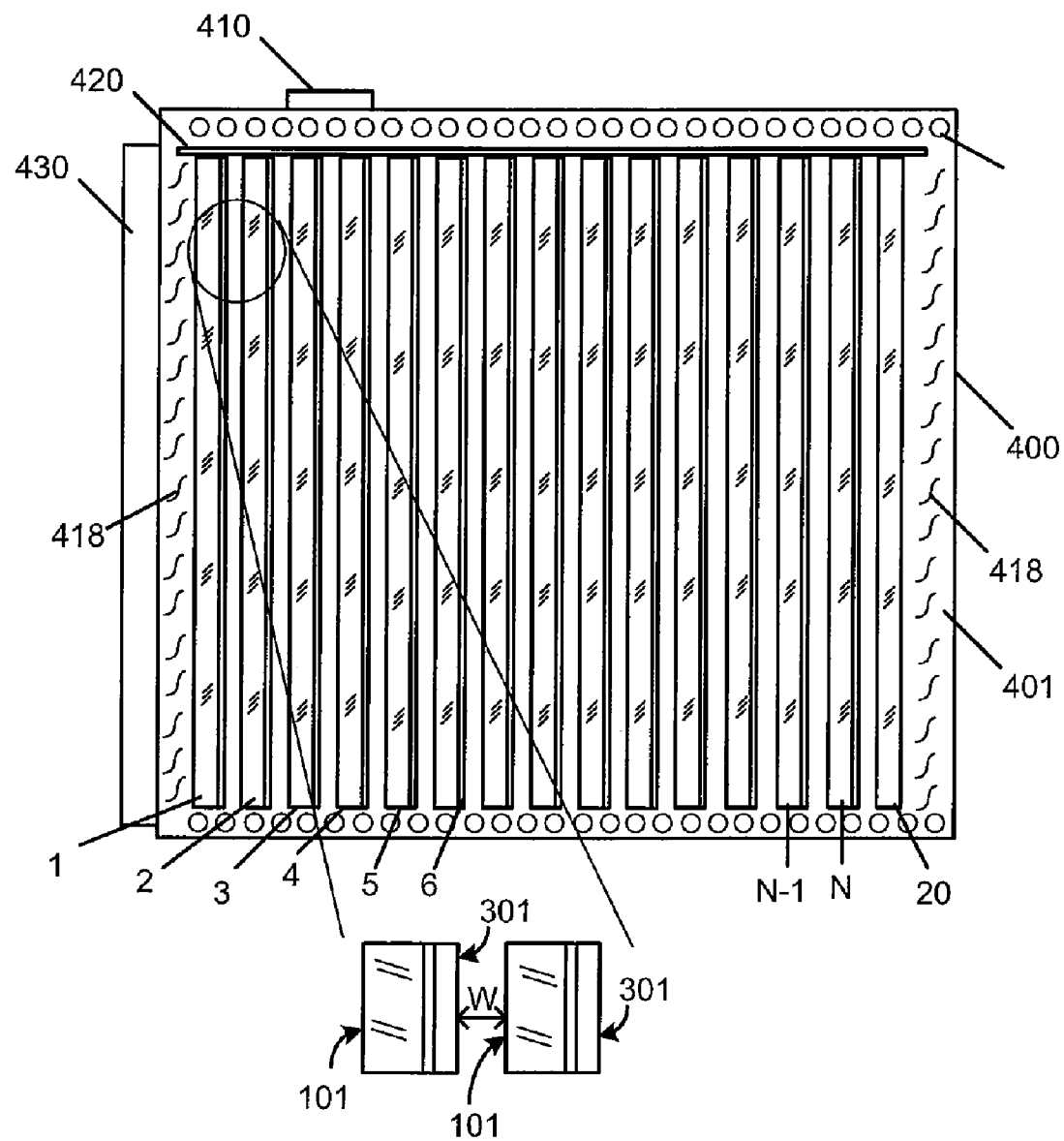

FIG. 6A shows another alternative embodiment of the present invention of processing the sodium doping in large scale batch system. As shown, a plurality of soda lime glass substrates numbered from 1 through N have been loaded in a sequential orientated manner within an internal region 401 of the furnace 400. Also, a blank soda lime glass substrate can be loaded in the furnace next to the soda lime glass substrate numbered N. Here N is an integer larger than 2. In one example, each of the plurality of soda lime glass substrates plus the blank soda lime glass substrate can be disposed along a hanger 420 with an substantial equal spacing W between each other in a vertical configuration relative to gravitational force. In one implementation, the spacing W is about a centimeter to a few centimeters or less but can be greater. Each of the soda line glass substrates has an overlying electrode layer and an overlying copper species based absorber precursor layer having an exposed face. The electrode layer can be the first electrode layer 200 overlying the substrate 100. The overlying copper species based absorber precursor layer can be the copper species based absorber precursor layer 300 overlying the first electrode layer 200. Each copper species based absorber precursor layer has an exposed face 301. Each of the soda line glass substrates also has a backside 101 composed of a portion of the corresponding soda lime glass substrate. As illustrated in FIG. 6A and particularly through an enlarged circled portion, each backside of the soda lime glass substrate numbered from 2 to N facing at least one exposed face of a neighbor soda line glass substrate numbered from 1 to N−1 and at least one of the exposed face numbered N facing a blank soda lime glass face also within the furnace. Depending on the scale of the furnace, the number N of the soda lime glass substrates held in above manner can be as larger as 40 or greater.

In a subsequent process (1060), the method 1000 includes applying thermal energy to the internal region of the furnace to transfer one or more sodium bearing species in the soda lime glass across the spacing into the copper species based absorber precursor layer via the exposed face. As shown in FIG. 5, FIG. 6, and FIG. 6A, the furnace 400 is configured to provide desired thermal energy 418 throughout the internal region 401 by ramping up temperature following a predetermined routine and rate. For example, the temperature can be ramped up from room temperature to about 400 degrees Celsius within a hydrogen selenide gas flowed into the furnace for approximately about ½ hour to about 1 hour and, optionally, a temperature ramped to about 500 degrees Celsius within a hydrogen sulfide gas added into the furnace internal region. The furnace is configured to ramp up temperature based on a controlled program and to be fixed at certain temperature within a suitable time period. The heating elements 415 are configured to distribute the thermal energy 418 substantially uniformly throughout the internal region 401.

Figure 7:
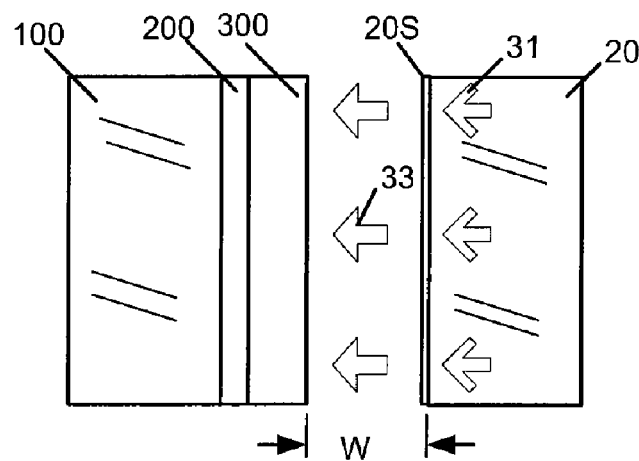

In a specific embodiment, each work piece (or simply a soda lime glass substrate with an overlying electrode layer and an copper species based absorber precursor layer) and each soda lime glass piece loaded in the furnace 400 are subjected to the thermal energy 418 which drives a diffusion process associated with sodium species existed within the soda lime glass. In particular, as schematically shown in FIG. 7, sodium species within the soda lime glass piece 20 are driven from higher concentrated internal portion of the soda lime glass towards a surface via a first diffusion process 31. Effectively, a sodium salt layer 20S is at least partially accumulated over the surface. The thermal energy 418 further would continue to induce a sublimation effect to cause sodium atoms to leave the sodium salt layer 20S into the open space defined by the spacing W. Another effective method is using hydrogen selenide $H_2Se$ gas as a work gas filled into the furnace 400 so that an exchange reaction can be induced thermally between the $H_2Se$ gas and sodium ions in layer 20S. In particular, the $H^+$ ion is replaced by the Na+, wherein the $H^+$ ion moves into the glass while $Na^+$ ion comes out of the sodium salt layer 20S to form $Na_2Se$ doped to absorber precursor layer 300 on the neighboring substrate facing the sodium salt layer 20S. Further, within the open space, a second diffusion process 33 would cause, at least partially, the sodium atoms to cross the spacing W and land on the exposed face of a copper species based absorber precursor layer 300 of a work piece disposed at the spacing W away. Finally, those sodium atoms or generally sodium species landed on the exposed face of the copper species based absorber precursor layer 300 would further diffuse into the whole layer thereof, effectively accomplishing a sodium doping process. In general, the same sodium doping process is applied to all work pieces in association with soda lime glass pieces configured as those in FIG. 6, effectively becoming a large scale batch system processing method.

Referring to FIG. 1 again, the method 1000 can include a process (1070) of forming a photovoltaic absorber layer. In a specific embodiment, this process includes a thermal treatment process on the formed copper species based absorber precursor layer after doped with sodium species in Process 1060. This process is also carried out in a furnace of the large scale batch system that has suitable temperature control and gas flow control. For example, the temperature of the furnace can be ramped up from room temperature (or even from 100 degree Celsius) to at least 500 degree Celsius and can be maintained at a fixed temperature with certain accuracy in about +/−a few degrees for any desirable time period. Multiple gas supplies with variable flow control are included so that a suitable chemical environment can be achieved. Optionally, nitrogen gas is supplied for providing desirable temperature uniformity within the furnace. The working gas for forming copper based Chalcopyrite structured compound semiconductor film can include hydrogen selenide, selenide vapor, and hydrogen sulfide.

Figure 8:
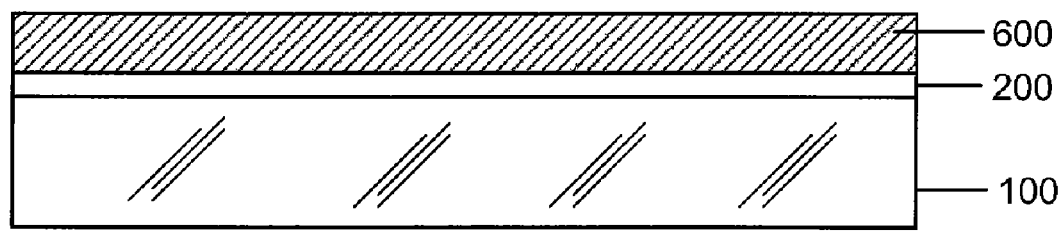

In another specific embodiment, the process 1070 for forming the photovoltaic absorber layer can be carried out substantially at the same furnace 400 and at the same time for performing sodium doping using the process 1060. In an implementation, the thermal treatment process is a sodium doping process combined with a selenization process. During the process, the internal region 401 of the furnace 400 is provided with $HSe_2$ gas or selenium vapor with a proper pressure value. Optionally, nitrogen gas may also be added to enhance the uniformity of temperature distribution throughout the internal region 401 of the furnace 400. The copper species based absorber precursor layers 300 on a plurality of soda lime glass substrates loaded into the furnace are doped with proper amount of sodium (in one embodiment, Na atomic concentration of about $5\times10^{19}$ $cm^{-3}$). At the same time, the sodium doped, copper species based absorber precursor layer 300 would react with the $H_2Se$ gas or selenium vapor subjecting to proper supply of thermal energy for a suitable time period. For example, the temperature may be ramped up from room temperature to about 400 degree Celsius for approximately about 30 minutes to an hour. Optionally, $H_2S$ gas may be added with the temperature being raised to about 500 degree Celsius. As a result, as schematically shown in FIG. 8, a copper species based absorber precursor layer 300, which is formed on an electrode layer 200 overlying a soda lime glass substrate 100, can be transformed into a polycrystalline film 600 with chalcopyrite structured grains made of $CuInGaSe_2$ (CIGS).

With the proper amount sodium doped in the copper species based absorber precursor layer 300, the chalcopyrite structured grains would grow as large as a few microns during the above thermal treatment process. The thin film having such large size polycrystalline grains with chalcopyrite CIGS material would substantially contribute a higher photo current as a photovoltaic absorber layer for the thin film solar cells formed thereafter. Although the above has been generally described in terms of a specific absorber structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein.

Referring to FIG. 1 again, the method 1000 would include one or more additional or alternative processes (namely Process 1080) for forming a thin film solar cell using large scale batch system processing. In one example, the process 1080 can be a sulfidization process, which is used to replace the selenization process in Process 1070, to form a different type of photovoltaic absorber layer made of copper indium gallium disulfide ($CuInGaS_2$) material. In another example, the method 1000 may include one or more other processes for forming a window layer overlying the formed photovoltaic absorber layer and growing one or more electrode layers for forming an upper or front electrode required for the thin film solar cells thereof. Other processes may include mechanical patterning to form one or more patterns into the electrode layer and make one or more interconnect structures. Still other processes may include storing the work pieces in proper low humidity environment or dipping into aqueous solution for avoid moisture damaging during the intermission between major processes. Of course, there can be many variations, alternatives, and modifications.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of processing a plurality of photovoltaic materials in a batch process, the method comprising:
   providing at least one transparent substrate having an overlying first electrode layer and an overlying copper species based absorber precursor layer within an internal region of a furnace, the overlying copper species based absorber precursor layer having an exposed face;
   disposing at least one soda lime glass comprising a soda lime glass face within the internal region of the furnace such that the soda lime glass face is adjacent to the exposed face of the at least one transparent substrate, and the soda lime glass face and the exposed face of the one transparent substrate are configured by a spacing between the soda lime glass face and the exposed face of the one transparent substrate; and
   subjecting the at least one transparent substrate and the one soda lime glass to thermal energy to transfer one or more sodium bearing species from the soda lime glass face across the spacing into the copper species based absorber precursor layer via the exposed face.

2. The method of claim 1 wherein the transfer one or more sodium bearing species comprises a sodium sublimation process at the soda lime glass face and a sodium deposition process at the exposed face of the one transparent substrate.

3. The method of claim 1 wherein the at least one transparent substrate comprising a soda lime glass having an overlying barrier layer between a surface of the one transparent substrate and the overlying first electrode layer, the barrier layer being configured to maintain one or more sodium species within the soda lime glass.

4. The method of claim 1 wherein the one soda lime glass comprises a sodium bearing concentration of 10% by weight and greater.

5. The method of claim 1 wherein the thermal energy causes one or more sodium species to diffuse from internal regions of the soda lime glass to form a sodium salt overlying a surface region of the soda lime glass face.

6. The method of claim 5 wherein the thermal energy corresponds to a temperature ramped up from room temperature to about 400 Degrees Celsius within a hydrogen selenide containing environment for approximately about ½ hour to about 1 hour and, optionally, a temperature ramped to about 500 Degrees Celsius within a hydrogen sulfide containing environment.

7. The method of claim 1 wherein the subjecting at least the one transparent substrate and the one soda lime glass to thermal energy forms a sodium doped copper species based absorber precursor layer, the sodium doped copper species based absorber precursor layer having a concentration of about $5\times10^{19}$ per cm$^3$.

8. The method of claim 1 further comprising removing the at least one transparent substrate from the furnace.

9. The method of claim 1 wherein the at least one transparent substrate is one of a plurality of transparent substrates within the furnace.

10. The method of claim 1 wherein the at least one transparent substrate and the one soda lime glass are placed within the furnace in a vertical configuration relative to gravitational force.

11. The method of claim 1 wherein the spacing comprising a range from 1 centimeter to 10 centimeters.

12. A method of processing a plurality of photovoltaic materials in a batch process, the method comprising:
    providing a plurality of soda lime glass substrates arranged in a sequential manner numbered from 1 through N within a furnace, each of the soda line glass substrates having an overlying first electrode layer, an overlying copper species based absorber precursor layer having an exposed face, and a backside composed of a portion of the soda lime glass substrate, each backside of the soda lime glass substrate numbered from 2 to N facing at least one exposed face of a neighbor soda line glass substrate numbered from 1 to N−1 and at least one of the exposed face numbered N facing a blank soda lime glass face also within the furnace, where N is an integer greater than 2; and
    subjecting the plurality of soda lime glass substrates and the blank soda lime substrate to thermal energy within the furnace to transfer one or more sodium bearing species to the exposed face of the copper species based absorber precursor layer for each of the soda lime glass substrates to dope each of the copper species based absorber precursor layer with sodium bearing species.

13. The method of claim 12 wherein the transfer one or more sodium bearing species comprises a sodium sublimation process at the soda lime glass face and a sodium deposition process at the exposed face of the one transparent substrate.

14. The method of claim 12 wherein each of the soda line glass substrates comprising an overlying barrier layer between a surface of each of the soda line glass substrates and the overlying first electrode layer, the barrier layer being configured to maintain one or more sodium species within each of the soda lime glass substrates.

15. The method of claim 12 wherein each of the soda line glass substrates comprises a sodium bearing concentration of 10% by weight and greater.

16. The method of claim 12 wherein the thermal energy causes one or more sodium species to diffuse from internal regions of each of the soda lime glass substrates to form a sodium salt overlying a portion of each backside of the soda lime glass substrates.

17. The method of claim 12 wherein the thermal energy corresponds to a temperature ramped up from room temperature to about 400 Degrees Celsius within a hydrogen selenide containing environment for approximately about ½ hour to about 1 hour and, optionally, a temperature ramped to about 500 Degrees Celsius within a hydrogen sulfide containing environment.

18. The method of claim 12 wherein the subjecting the plurality of soda lime glass substrates and the blank soda lime substrate to thermal energy results in sodium doping into each of the copper species based absorber precursor layer with a sodium concentration of about $5\times10^{19}$ per cm$^3$.

19. The method of claim 12 wherein the subjecting the plurality of soda lime glass substrates and the blank soda lime substrate to thermal energy further comprises a selenization process for transforming the copper species based absorber precursor layer into a copper indium diselenide photovoltaic absorber layer.

20. The method of claim 12 wherein the providing a plurality of soda lime glass substrates arranged in a sequential manner numbered from 1 through N within a furnace comprises disposing each of the plurality of soda lime glass substrate with an substantial equal spacing in a vertical configuration relative to gravitational force.

* * * * *